(12) United States Patent
Liu et al.

(10) Patent No.: US 12,369,482 B2
(45) Date of Patent: Jul. 22, 2025

(54) DISPLAY PANEL AND TEMPERATURE REGULATION METHOD THEREFOR

(71) Applicant: WUHAN CHINA STAR OPTOELECTRONICS SEMICONDUCTOR DISPLAY TECHNOLOGY CO., LTD., Hubei (CN)

(72) Inventors: Shengze Liu, Hubei (CN); Chongpeng Ruan, Hubei (CN); Chunpeng Zhang, Hubei (CN); Wenxu Xianyu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/623,599

(22) PCT Filed: Dec. 23, 2021

(86) PCT No.: PCT/CN2021/140817
§ 371 (c)(1),
(2) Date: Dec. 28, 2021

(87) PCT Pub. No.: WO2023/108786
PCT Pub. Date: Jun. 22, 2023

(65) Prior Publication Data
US 2024/0040892 A1 Feb. 1, 2024

(30) Foreign Application Priority Data
Dec. 16, 2021 (CN) .......................... 202111545475.5

(51) Int. Cl.
*H10K 59/00* (2023.01)
*G05D 23/20* (2006.01)
(Continued)

(52) U.S. Cl.
CPC ......... *H10K 59/60* (2023.02); *G05D 23/2034* (2013.01); *H10K 59/122* (2023.02); *H10K 59/8792* (2023.02)

(58) Field of Classification Search
CPC .... H10K 59/122; H10K 59/126; H10K 59/13; H10K 59/60; H10K 59/8792
See application file for complete search history.

(56) References Cited

U.S. PATENT DOCUMENTS

2022/0320197 A1* 10/2022 Wang ................... H10K 59/126

FOREIGN PATENT DOCUMENTS

| CN | 107451576 A | 12/2017 |
| CN | 108803702 A | 11/2018 |

(Continued)

OTHER PUBLICATIONS

International Search Report in International application No. PCT/CN2021/140817, mailed on Sep. 20, 2022.
(Continued)

*Primary Examiner* — Reema Patel
(74) *Attorney, Agent, or Firm* — PV IP PC; Wei Te Chung

(57) ABSTRACT

A display panel and a temperature regulation method for a display panel are provided. The display includes a substrate, a thin film transistor layer, a first passivation layer, a photoelectric detector, a first light-shielding layer, and a second light-shielding layer. The first light-shielding layer is disposed on one side of the photoelectric detector away from the substrate. The second light-shielding layer is disposed on the lateral of the photoelectric detector.

20 Claims, 4 Drawing Sheets

(51) Int. Cl.
      *H10K 59/122*     (2023.01)
      *H10K 59/60*      (2023.01)
      *H10K 59/80*      (2023.01)

(56) References Cited

FOREIGN PATENT DOCUMENTS

| | | | | |
|---|---|---|---|---|
| CN | 108987455 A | | 12/2018 | |
| CN | 110993616 A | | 4/2020 | |
| CN | 113053965 A | | 6/2021 | |
| CN | 113544855 A | * | 10/2021 | ......... G06V 40/1318 |
| JP | 2007059244 A | | 3/2007 | |

OTHER PUBLICATIONS

Written Opinion of the International Searching Authority in International application No. PCT/CN2021/140817, mailed on Sep. 20, 2022.

\* cited by examiner

DISPLAY PANEL AND TEMPERATURE REGULATION METHOD THEREFOR

FIELD OF THE DISCLOSURE

The application relates to a field of display technology, and in particular to a display panel and a temperature regulation method therefor.

BACKGROUND

OLEDs (Organic Light-Emitting Diodes) have advantages including low voltage requirements, high power saving efficiency, fast response, light weight, thin thickness, simple structures, low cost, wide viewing angles, almost infinitely high contrast, low power consumption, extremely high response speed, etc. and have become one of the most important display technologies today.

During use, the temperature of the display panel will change. The temperature of the display panel is too high or too low, which will affect the luminous effect of the display panel, resulting in a reduction in the service life of the display panel. Currently, the temperature of the display panel cannot be monitored and regulated in real time.

SUMMARY

The present disclosure provides a display panel and a temperature regulation method therefor, which can solve the problem that temperatures of existing display panels cannot be monitored and regulated in real time.

The present disclosure provides a display panel. The display panel includes a substrate, a thin film transistor layer disposed on the substrate, a first passivation layer, a photoelectric detector, a first light-shielding layer, and a second light-shielding layer. The first passivation layer is disposed on a surface of one side of the thin film transistor layer away from the substrate. The photoelectric detector includes a first electrode disposed on a surface of one side of the first passivation layer away from the substrate, an active layer disposed on a surface of one side of the first electrode away from the substrate, and a second electrode disposed on a surface of one side of the active layer away from the substrate. The first light-shielding layer covers one side of the active layer away from the substrate. The second light-shielding layer is disposed on a surface of one side of the first electrode away from the substrate. The first light-shielding layer is provided with a first opening at a position corresponding to the first electrode. The active layer is disposed in the first opening.

Furthermore, the display panel further comprises: an anode disposed on one side of the first passivation layer away from the substrate; a pixel definition layer disposed on a surface of one side of the anode away from the substrate, the pixel definition layer is provided with a second opening at a position corresponding to the anode; a light-emitting layer disposed on a surface of one side of the anode away from the substrate in the second opening; and a cathode disposed on a surface of one side of the light-emitting layer away from the substrate. The anode and the first electrode are opaque electrodes.

Furthermore, the second electrode is a light-transmissive electrode, the first light-shielding layer is disposed on one side of the second electrode away from the substrate.

Furthermore, the second electrode is an opaque electrode, the second electrode is multiplexed as the first light-shielding layer.

Furthermore, the anode is disposed on one side of the photoelectric detector away from the substrate.

Furthermore, the display panel further comprises a protective layer and a second passivation layer. The protective layer is disposed between the second electrode and the anode and extends to cover the surface of one side of the second light-shielding layer away from the substrate. The second passivation layer is disposed on the protective layer and the anode.

Furthermore, a projection of the photoelectric detector on the substrate is away from a projection of the anode on the substrate, and the protective layer is disposed between the first light-shielding layer and the anode.

Furthermore, a projection of the photoelectric detector on the substrate is within a projection of the anode on the substrate, the anode is multiplexed as the first light-shielding layer.

Furthermore, the anode and the first electrode are disposed in the same layer.

Furthermore, the cathode is multiplexed as the second electrode.

Furthermore, the pixel definition layer is composed of a light-shielding material, the pixel definition layer is multiplexed as the second light-shielding layer.

Furthermore, the thin film transistor layer comprises a first thin film transistor device that includes a first source electrically connected to the first electrode of the photoelectric detector, and a first drain electrically connected to a control chip.

Furthermore, the photoelectric detector further comprises a first transmission layer, disposed between the first electrode and the active layer, and a second transmission layer, disposed between the active layer and the second electrode.

Furthermore, the display panel further comprises a buffer layer, disposed between the substrate and the thin film transistor layer.

The present disclosure provides a temperature regulation method for a display panel. The display panel includes a substrate, a thin film transistor layer disposed on the substrate, a first passivation layer, a photoelectric detector, a first light-shielding layer, and a second light-shielding layer. The first passivation layer is disposed on a surface of one side of the thin film transistor layer away from the substrate. The photoelectric detector includes a first electrode disposed on a surface of one side of the first passivation layer away from the substrate, an active layer disposed on a surface of one side of the first electrode away from the substrate, and a second electrode disposed on a surface of one side of the active layer away from the substrate. The first light-shielding layer covers one side of the active layer away from the substrate. The second light-shielding layer is disposed on a surface of one side of the first electrode away from the substrate. The first light-shielding layer is provided with a first opening at a position corresponding to the first electrode. The active layer is disposed in the first opening. The method includes: obtaining dark current values of a photoelectric detector at different temperatures to obtain a temperature-current fitting curve; obtaining a real-time dark current value of the photoelectric detector through a first thin film transistor device; obtaining a real-time temperature value corresponding to the real-time dark current value from the temperature-current fitting curve according to the real-time dark current value; determining whether the real-time temperature value is within a preset temperature range and performing temperature regulation when the real-time temperature value exceeds the preset temperature range.

Through disposing the first light-shielding layer on one side of the active layer of the photoelectric detector away from the substrate and disposing the second light-shielding layer on the laterals of the active layer of the photoelectric detector, light is prevented from entering the inside of the active layer of the photoelectric detector, so that the active layer of the photoelectric detector generates a dark current. Using the relationship between the dark current of the photoelectric detector and the temperature, the temperature of the photoelectric detector can be monitored in real time. When the real-time temperature value exceeds the preset temperature range, the temperature regulation is performed to regulate the temperature of the photoelectric detector. Through using the temperature of the photoelectric detector to represent the temperature of the display panel, the technical effect of monitoring and regulating the real-time temperature of the display panel is achieved.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

REFERENCE CHARACTER

100 Display panel;
1 Substrate; 2 Buffer layer;
3 Thin film transistor layer; 4 First passivation layer;
4 Photoelectric detector; 6 First light-shielding layer;
7 Second light-shielding layer; 8 Anode;
9 Light-emitting layer; 10 Cathode;
11 Pixel definition layer; 12 Encapsulation layer;
13 Protective layer; 14 Second passivation layer;
31 First thin film transistor device; 32 Second thin film transistor device;
311 First active layer; 312 First insulating layer;
313 First gate layer; 314 Second insulating layer;
315 Second gate layer; 316 Third insulating layer;
317 First source/drain layer; 51 First electrode;
52 Active layer; 53 Second electrode;
54 First transmission layer; 55 Second transmission layer.

DETAILED DESCRIPTION

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The terminology used herein is for the purpose of describing particular embodiments only and is not intended to be limiting of the invention. As used herein, the singular forms "a", "said" and "the" are intended to include the plural forms as well, unless the context clearly indicates otherwise. It will be understood that the term "and/or," when used in this specification, specify one or more associated elements, alone or in combination, are provided. It will be further understood that the terms "first," "second," "third," and "fourth," when used in this specification, claim and drawings, are used to distinguish different objects, rather than to describe a specific order. It will be further understood that the terms "comprises" and/or "comprising," when used in this specification, specify the presence of stated features, products, steps, operations, elements, and/or components, but do not preclude the presence or addition of one or more other features, products, steps, operations, elements, components, and/or groups thereof.

Embodiment 1

Figure 1:
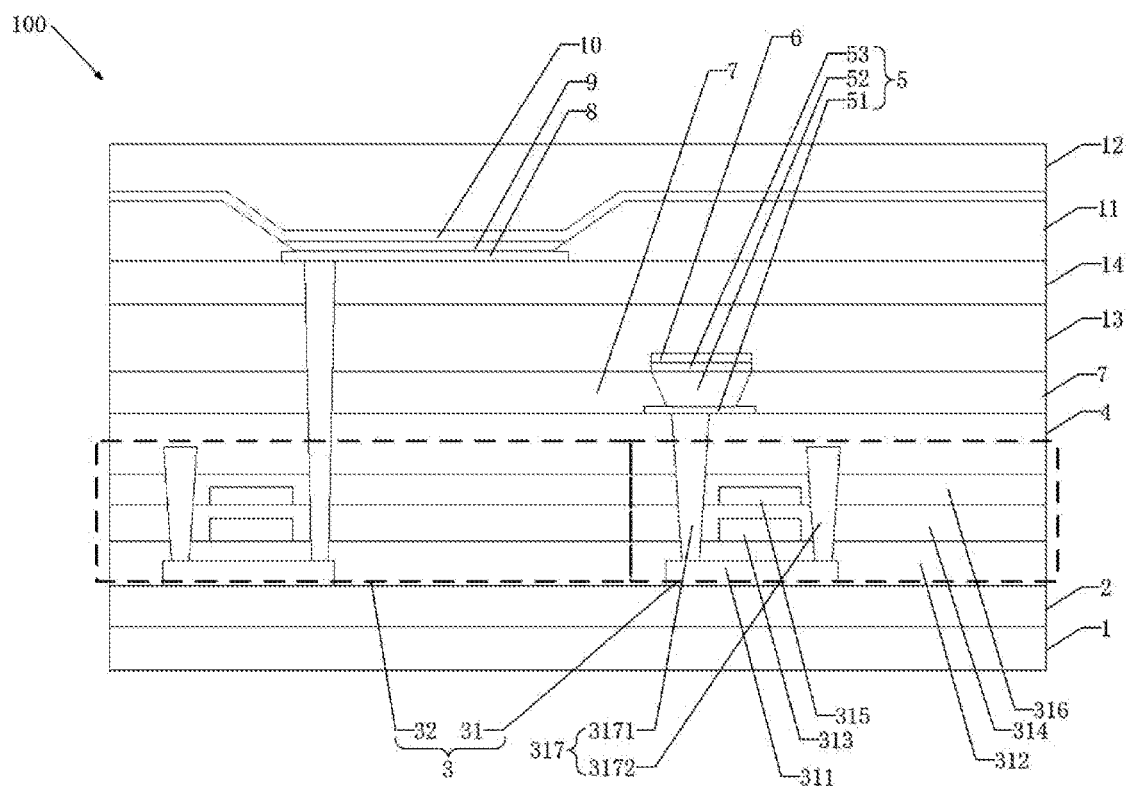
FIG. 1 is a schematic diagram of a structure of a display panel of Embodiment 1 of the present disclosure.

As shown in FIG. 1, the present invention provides a display panel 100. The display panel 100 comprises a substrate 1, a buffer layer 2, a thin film transistor layer 3, a first passivation layer 4, a photoelectric detector 5, a first light-shielding layer 6, a second light-shielding layer 7, an anode 8, a light-emitting layer 9, a cathode 10, a pixel definition layer 11, and an encapsulation layer 12.

The material of the substrate 1 comprises polyimide, polycarbonate, polyethylene terephthalate, polyethylene naphthalate, and so on. Therefore, the substrate 1 has better impact resistance and can effectively protect the display panel 100.

The buffer layer 2 is disposed on the surface of one side of the substrate 1. The buffer layer 2 mainly provides a buffering effect, and its material can be SiOx, SiNx, SiNOx, or a combined structure of SiNx and SiOx.

The thin film transistor layer 3 is disposed on the surface of one side of the buffer layer 2 away from the substrate 1.

As shown in FIG. 1, the thin film transistor layer 3 comprises a first thin film transistor device 31 and a second thin film transistor device 32.

A terminal of the first thin film transistor device 31 is electrically connected to the photoelectric detector 5, and another terminal thereof is electrically connected to a control chip (not shown).

The first thin film transistor device 31 comprises a first active layer 311, a first insulating layer 312, a first gate layer 313, a second insulating layer 314, a second gate layer 315, a third insulating layer 316, and a first source/drain layer 317.

The first active layer 311 is disposed on the surface of one side of the buffer layer 2 away from the substrate 1. The first active layer 311 may be an oxide semiconductor or other types of semiconductors, such as IGZO, IGTO, IGO, IZO, AIZO, etc.

The first insulating layer 312 is disposed on the surface of one side of the first active layer 311 away from the substrate 1 and extends to cover the surface of one side of the buffer layer 2 away from the substrate 1. The first insulating layer 312 mainly prevents a short-circuit caused by the contact between the first active layer 311 and the first gate layer 313.

The first insulating layer 312 comprises one or more of SiOx, SiNx, and $Al_2O_3$. The first gate layer 313 is disposed on the surface of one side of the first insulating layer 312 away from the substrate 1. The material of the first gate layer 313 comprises one or more of Cu, Mo, Al, IZO, ITO, Ni, NiCr, and CuNb.

The second insulating layer 314 is disposed on the surface of one side of the first gate layer 313 away from the substrate 1 and extends to cover the surface of one side of the first insulating layer 312 away from the substrate 1. The second insulating layer 314 prevents a short-circuit caused the contact between the first gate layer 313 and the second gate layer 315. The second insulating layer 314 comprises one or more of SiOx, SiNx, and $Al_2O_3$.

The second gate layer 315 is disposed on the surface of one side of the second insulating layer 314 away from the substrate 1. The material of the second gate layer 315 comprises one or more of Cu, Mo, Al, IZO, ITO, Ni, NiCr, and CuNb.

The third insulating layer 316 is disposed on the surface of one side of the second gate layer 315 away from the substrate 1 and extends to cover the surface of one side of the second insulating layer 314 away from the substrate 1. The third insulating layer 316 mainly prevents a short-circuit caused by the contact between the second gate layer 315 and the first source/drain layer 317 from being short-circuited. The third insulating layer 316 comprises one or more of SiOx, SiNx, and $Al_2O_3$.

The first source/drain layer 317 is disposed on the surface of one side of the third insulating layer 316 away from the substrate 1 and is electrically connected to the first active layer 311. The material of the first source/drain layer 317 comprises one or more of Cu, Mo, Al, IZO, ITO, Ni, NiCr, and CuNb.

The first source/drain layer 317 comprises a first source 3171 and a first drain 3172. The first source 3171 is electrically connected to a first electrode 51 of the photoelectric detector 5. The first drain 3172 is electrically connected to a control chip (not shown). The control chip can be used to control only temperature regulation, or to control temperature regulation and display at the same time.

The first passivation layer 4 is disposed on the surface of one side of the thin film transistor layer 3 away from the substrate 1. The first passivation layer 4 mainly provides a flat surface for the film layer above the first passivation layer 4.

The photoelectric detector 5 is disposed on the surface of one side of the first passivation layer 4 away from the substrate 1.

As shown in FIG. 1, the photoelectric detector 5 comprises a first electrode 51, an active layer 52, and a second electrode 53.

The first electrode 51 is disposed on the surface of one side of the first passivation layer 4 away from the substrate 1. In the embodiment, the first electrode 51 is an opaque electrode. That is, the first electrode 51 is manufactured or formed by an opaque material.

The active layer 52 is disposed on the surface of one side of the first electrode 51 away from the substrate 1.

The second electrode 53 is disposed on the surface of one side of the active layer 52 away from the substrate 1. In the embodiment, the second electrode 53 is a light-transmissive electrode. The light-transmissive electrode described here refers to an electrode capable of transmitting light.

In other embodiments, the second electrode 53 may be an opaque electrode. At this time, the second electrode 53 may be multiplexed as the first light-shielding layer 6.

Figure 2:
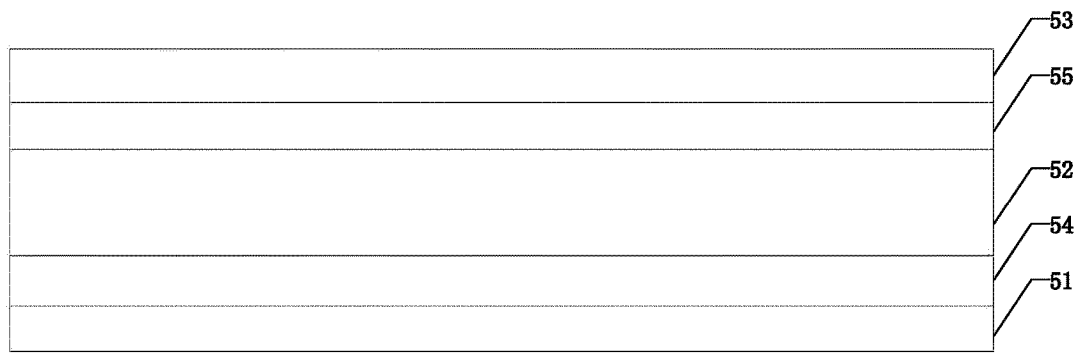
FIG. 2 is a schematic diagram of a structure of a photoelectric detector of the present disclosure.

As shown in FIG. 2, the photoelectric detector 5 further comprises a first transmission layer 54 and a second transmission layer 55. The first transmission layer 54 is disposed between the first electrode 51 and the active layer 52. The second transmission layer is disposed between the active layer 52 and the second electrode 53.

As shown in FIG. 1, the first light-shielding layer 6 covers one side of the active layer 52 away from the substrate 1, and is used to block the light above the active layer 52 of the photoelectric detector 5 from entering the inside of the active layer 52 of the photoelectric detector 5. The material of the first light-shielding layer 6 comprises a black-matrix type light-shielding material and a metal type light-shielding material. In the embodiment, the first light-shielding layer 6 is a black-matrix type light-shielding material.

In other embodiments, when the first light-shielding layer 6 is a metal type light-shielding material, the first light-shielding layer 6 can be multiplexed as the second electrode 53 of the photoelectric detector 5, that is, the second electrode 53 disposed between the first light-shielding layer 6 and the active layer 52 can be removed.

As shown in FIG. 1, the second light-shielding layer 7 is disposed on the surface of one side of the first electrode 51 away from the substrate 1. The first second light-shielding layer 7 is provided with a first opening at a position corresponding to the first electrode 51. The active layer 52 is disposed in the first opening. The second light-shielding layer 7 is used to block the light from the laterals of the active layer 52 of the photoelectric detector 5 from entering the inside of the active layer 52 of the photoelectric detector 5.

The operation mechanism of the photoelectric detector 5 is based on the photovoltaic effect. That is, photo-generated excitons are generated in the material of the acceptor after illumination, and the photogenerated excitons diffuse to the interface of the acceptor and decompose to produce free electrons and holes. The electronic holes are transmitted to two terminals of the electrode and then collected.

When no incident light illuminates the photoelectric detector 5, under a reverse bias condition, a dark current is generated in response to the potential barrier caused by the energy-level difference between the work function of the first electrode 51 and the LUMO (conduction band) of the active layer 52, the potential barrier caused by the energy-level difference between the work function of the second electrode 53 and the HOMO (valence band) of the active layer in the photoelectric detector 5, and the thermal electrons generated by the active layer 52 in the photoelectric detector 5.

According to Richardson-Dushman Equation $$J \propto \exp\left(-\frac{\Delta E}{kT}\right),$$

the relationship between the dark current and the temperature can be obtained, wherein, J is the current density, ΔE is related to the material of the active layer 52, k is the Boltzmann constant, and T is the temperature.

Through disposing the first light-shielding layer 6 on one side of the active layer 52 of the photoelectric detector 5 away from the substrate 1 and disposing the second light-shielding layer 7 on the laterals of the active layer 52 of the photoelectric detector 5, light is prevented from entering the inside of the active layer 52 of the photoelectric detector 5, so that the active layer 52 of the photoelectric detector 5 generates a dark current. Using the relationship between the dark current of the active layer 52 of the photoelectric detector 5 and the temperature, the temperature of the photoelectric detector 5 can be monitored in real time. When the real-time temperature value exceeds the preset temperature range, the temperature regulation is performed to regulate the temperature of the photoelectric detector 5. Through using the temperature of the photoelectric detector 5 to represent the temperature of the display panel 100, the technical effect of monitoring and regulating the real-time temperature of the display panel 100 is achieved.

In the embodiment, the display panel 100 further comprises a protective layer 13 and a second passivation layer 14.

The protective layer 13 is disposed on the surface of one side of the first light-shielding layer 6 away from the substrate 1 and extends to cover the surface of one side of the second light-shielding layer 7 away from the substrate 1. The protective layer 13 is mainly used to prevent the photoelectric detector 5 from being corroded by water and oxygen, thereby increasing the service life of the photoelectric detector 5.

The second passivation layer 14 is disposed on the surface of one side of the protective layer 13 away from the substrate 1. The second passivation layer 14 mainly provides a flat surface for the film layer above the second passivation layer 14.

The anode 8 is disposed on one side of the second passivation layer 14 away from the substrate 1. The anode 8 is an opaque electrode. The projection of the photoelectric detector 5 on the substrate 1 is away from the projection of the anode 8 on the substrate 2. The projection of the photoelectric detector 5 on the substrate 1 and the projection of the anode 8 on the substrate 1 do not overlap each other.

The pixel definition layer 11 is disposed on the surface of one side of the anode 8 away from the substrate 1. The pixel definition layer 11 is provided with a second opening at a position corresponding to the anode 8.

The light-emitting layer 9 is disposed on the surface of one side of the anode 8 away from the substrate 1 in the second opening.

The cathode 10 is disposed on the surface of one side of the light-emitting layer 9 away from the substrate 1. The cathode 10 is an electrode with relatively high light transmission.

The encapsulation layer 12 is disposed on the surface of one side of the cathode 10 away from the substrate 1 and extends to cover the surface of one side of the pixel definition layer 11 away from the substrate 1. The encapsulation layer 12 is mainly used to prevent the encroachment of water and oxygen, thereby increasing the service life of the display panel 100.

Figure 3:
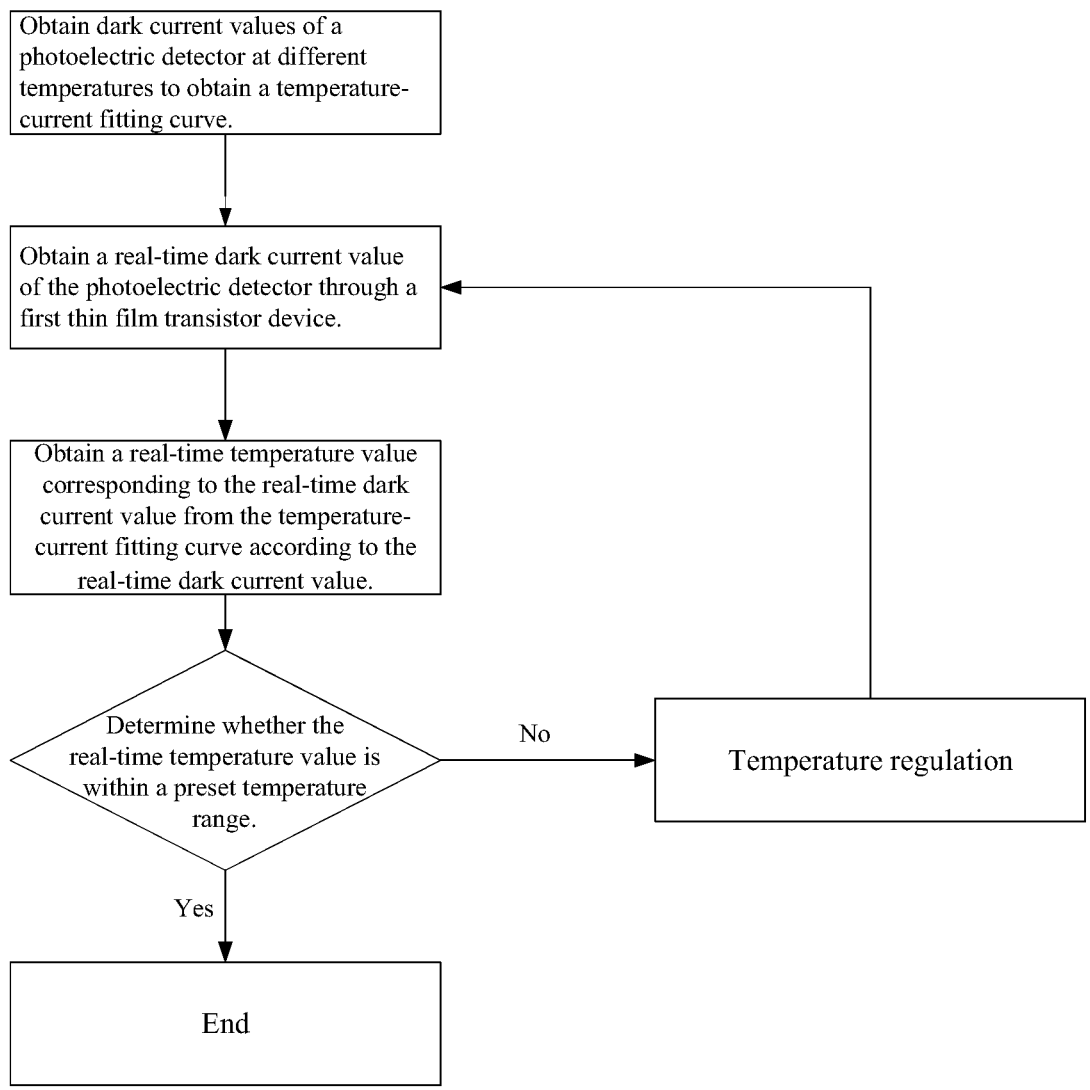
FIG. 3 is a flow chart of a temperature regulation method of a display panel of the present disclosure.

As shown in FIG. 3, the embodiment also provides a temperature regulation method of the display panel 100, which comprises: S1, the control chip obtains dark current values of the photoelectric detector 5 at different temperatures to obtain a temperature-current fitting curve; S2, the control chip obtains a real-time dark current value of the photoelectric detector 5 through the first thin film transistor device 31; S3, the control chip obtains a real-time temperature value corresponding to the real-time dark current value from the temperature-current fitting curve according to the real-time dark current value; and S4, the control chip determines whether the real-time temperature value is within a preset temperature range and performs the temperature regulation when the real-time temperature value exceeds the preset temperature range.

Embodiment 2

Figure 4:
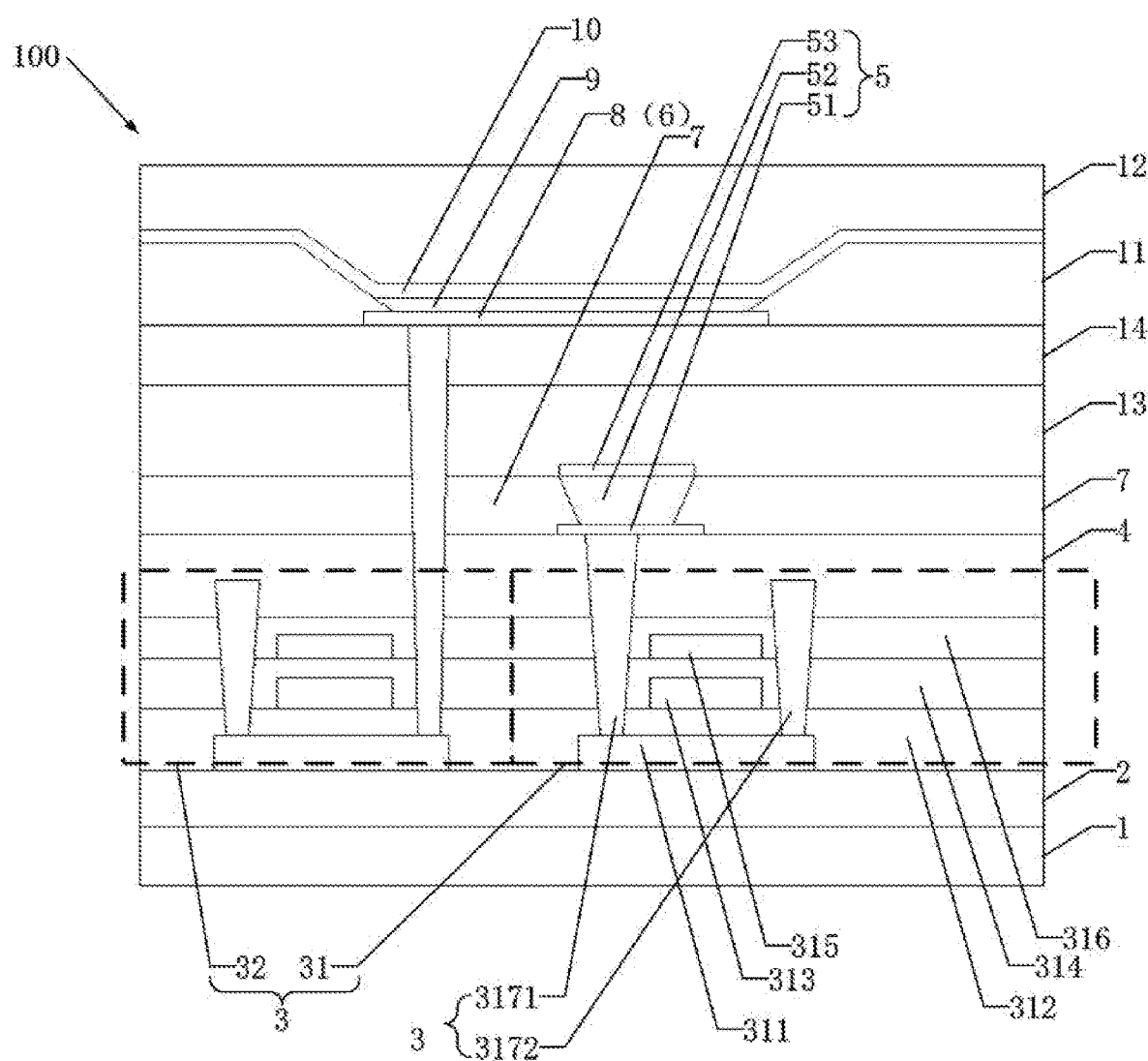
FIG. 4 is a schematic diagram of a structure of a display panel of Embodiment 2 of the present disclosure.

As shown in FIG. 4, in Embodiment 2, the projection of the photoelectric detector 5 on the substrate 1 is within the projection of the anode 8 on the substrate 1, and the anode 8 is multiplexed as the first light-shielding layer 6. The protective layer 13 is disposed between the second electrode 53 and the anode 8, and extends to cover the surface of one side of the second light-shielding layer 7 away from the substrate 1.

Since the anode 8 itself is an opaque electrode and the projection of the photoelectric detector 5 on the substrate 1 falls within the projection of the anode 8 on the substrate 1, the anode 8 can be used as the first light-shielding layer 6. Therefore, the production cost of the display panel 100 can be saved.

Through disposing the anode 8 to cover the top surface of the active layer 52 of the photoelectric detector 5 and disposing the second light-shielding layer 7 on the laterals of the active layer 52 of the photoelectric detector 5, light is prevented from entering the inside of the active layer 52 of the photoelectric detector 5, so that the active layer 52 of the photoelectric detector 5 generates a dark current. Using the relationship between the dark current of the active layer 52 of the photoelectric detector 5 and the temperature, the temperature of the photoelectric detector 5 can be monitored in real time. When the real-time temperature value exceeds the preset temperature range, the temperature regulation is performed to regulate the temperature of the photoelectric detector 5. Through using the temperature of the photoelectric detector 5 to represent the temperature of the display panel 100, the technical effect of monitoring and regulating the real-time temperature of the display panel 100 is achieved.

Embodiment 3

Figure 5:
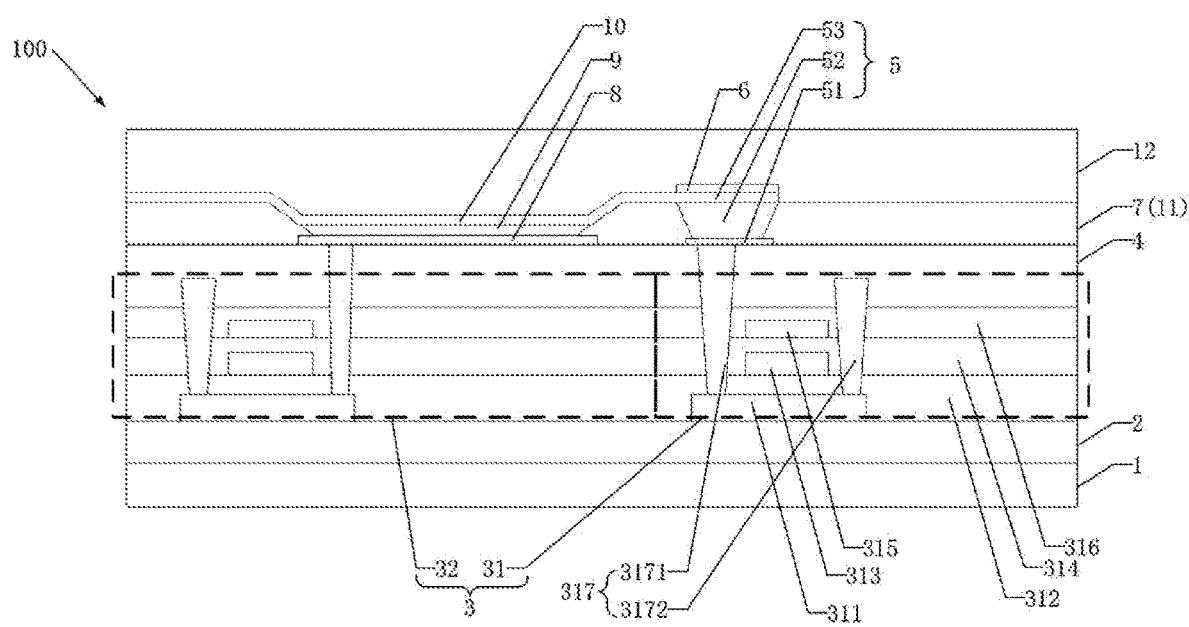
FIG. 5 is a schematic diagram of a structure of a display panel of Embodiment 3 of the present disclosure.

As shown in FIG. 5, in Embodiment 3, the anode 8 and the first electrode 51 are disposed in the same layer.

The cathode 10 is multiplexed as the second electrode 53. Therefore, the photomask can be saved, the manufacturing cost of the display panel 100 can be reduced, and the production efficiency of the display panel 100 can be improved.

The pixel definition layer 11 is composed of a light-shielding material, that is, the pixel definition layer 11 is a light-shielding film layer. At this time, the pixel definition layer 11 is multiplexed as the second light-shielding layer 7. The pixel definition layer 11 is used to prevent side light from entering the active layer 52. Therefore, the photomask can be saved, the manufacturing cost of the display panel 100 can be reduced, and the production efficiency of the display panel 100 can be improved.

Through disposing the first light-shielding layer 6 on one side of the second electrode 53 of the photoelectric detector 5 away from the substrate 1 and disposing the second light-shielding layer 7 on the laterals of the photoelectric detector 5, light is prevented from entering the inside the photoelectric detector 5, so that the photoelectric detector 5 generates a dark current. Using the relationship between the dark current of the photoelectric detector 5 and the temperature, the temperature of the photoelectric detector 5 can be monitored in real time. When the real-time temperature value exceeds the preset temperature range, the temperature regulation is performed to regulate the temperature of the photoelectric detector 5, thereby achieving the technical effect of monitoring and regulating the real-time temperature of the display panel 100 is achieved.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. A display panel comprising:
   a substrate;
   a thin film transistor layer disposed on the substrate;
   a first planarization layer disposed on a side of the thin film transistor layer away from the substrate;
   a photoelectric detector comprising:
     a first electrode disposed on a side of the first planarization layer away from the substrate;
     an active layer disposed on a side of the first electrode away from the substrate; and
     a second electrode disposed on a side of the active layer away from the substrate;
   a first light-shielding layer covering the side of the active layer away from the substrate; and
   a second light-shielding layer disposed on the side of the first electrode away from the substrate, the second light-shielding layer being provided with a first opening at a position corresponding to the first electrode,
   wherein the active layer is disposed in the first opening.

2. The display panel of claim 1, further comprising:
   an anode disposed on the side of the first planarization layer away from the substrate;
   a pixel definition layer disposed on a side of the anode away from the substrate, the pixel definition layer being provided with a second opening at a position corresponding to the anode;
   a light-emitting layer disposed on the side of the anode away from the substrate in the second opening; and
   a cathode disposed on a side of the light-emitting layer away from the substrate,
   wherein the anode and the first electrode are opaque electrodes.

3. The display panel of claim 2, wherein the second electrode is a transparent electrode, and the first light-shielding layer is disposed on a side of the second electrode away from the substrate.

4. The display panel of claim 2, wherein the second electrode is an opaque electrode, and the second electrode is multiplexed as the first light-shielding layer.

5. The display panel of claim 3, wherein the anode is disposed on a side of the photoelectric detector away from the substrate.

6. The display panel of claim 5, further comprising:
   a protective layer, disposed between the second electrode and the anode and extending to cover a side of the second light-shielding layer away from the substrate; and
   a second planarization layer, disposed between the protective layer and the anode.

7. The display panel of claim 6, wherein an orthographic projection of the photoelectric detector on the substrate is spaced apart from an orthographic projection of the anode on the substrate, and the protective layer is disposed between the first light-shielding layer and the anode.

8. The display panel of claim 6, wherein an orthographic projection of the photoelectric detector on the substrate is within an orthographic projection of the anode on the substrate, and the anode is multiplexed as the first light-shielding layer.

9. The display panel of claim 3, wherein the anode and the first electrode are disposed in a same layer.

10. The display panel of claim 9, wherein the cathode is multiplexed as the second electrode.

11. The display panel of claim 9, wherein the pixel definition layer is composed of a light-shielding material, and the pixel definition layer is multiplexed as the second light-shielding layer.

12. The display panel of claim 1, wherein the thin film transistor layer comprises:
    a first thin film transistor device comprising:
      a first source electrically connected to the first electrode of the photoelectric detector; and
      a first drain electrically connected to a control chip.

13. The display panel of claim 1, wherein the photoelectric detector further comprises:
    a first transmission layer, disposed between the first electrode and the active layer; and
    a second transmission layer, disposed between the active layer and the second electrode.

14. The display panel of claim 1, further comprising:
    a buffer layer, disposed between the substrate and the thin film transistor layer.

15. A temperature regulation method for a display panel, comprising:
    obtaining dark current values of a photoelectric detector at different temperatures to obtain a temperature-current fitting curve;
    obtaining a real-time dark current value of the photoelectric detector through a first thin film transistor device;
    obtaining a real-time temperature value corresponding to the real-time dark current value from the temperature-current fitting curve according to the real-time dark current value; and
    in response to determining that the real-time temperature value exceeds a preset temperature range, performing temperature regulation,
    wherein the display panel comprises:
    a substrate;
    a thin film transistor layer disposed on the substrate;
    a first planarization layer disposed on a side of the thin film transistor layer away from the substrate;
    the photoelectric detector comprising:
      a first electrode disposed on a side of the first planarization layer away from the substrate;
      an active layer disposed on a side of the first electrode away from the substrate; and
      a second electrode disposed on a side of the active layer away from the substrate;

a first light-shielding layer covering the side of the active layer away from the substrate; and a second light-shielding layer disposed on the side of the first electrode away from the substrate, the second light-shielding layer being provided with a first opening at a position corresponding to the first electrode, wherein the active layer is disposed in the first opening.

16. The temperature regulation method of claim 15, wherein the display panel further comprises:

an anode disposed on the side of the first planarization layer away from the substrate;

a pixel definition layer disposed on a side of the anode away from the substrate, the pixel definition layer being provided with a second opening at a position corresponding to the anode;

a light-emitting layer disposed on the side of the anode away from the substrate in the second opening; and a cathode disposed on a side of the light-emitting layer away from the substrate, wherein the anode and the first electrode are opaque electrodes.

17. The temperature regulation method of claim 16, wherein the second electrode is a transparent electrode, and the first light-shielding layer is disposed on a side of the second electrode away from the substrate.

18. The temperature regulation method of claim 16, wherein the second electrode is an opaque electrode, and the second electrode is multiplexed as the first light-shielding layer.

19. The temperature regulation method of claim 17, wherein the anode is disposed on a side of the photoelectric detector away from the substrate.

20. The temperature regulation method of claim 19, wherein the display panel further comprises:

a protective layer, disposed between the second electrode and the anode and extending to cover a side of the second light-shielding layer away from the substrate; and a second planarization layer, disposed between the protective layer and the anode.

* * * * *